US010712372B2

(12) United States Patent
Grumel et al.

(10) Patent No.: US 10,712,372 B2
(45) Date of Patent: Jul. 14, 2020

(54) CURRENT MEASUREMENT DEVICE, MANUFACTURING METHOD, PROTECTION MODULE AND DIFFERENTIAL CIRCUIT BREAKER INCLUDING SUCH A DEVICE

(71) Applicant: Schneider Electric Industries SAS, Rueil Malmaison (FR)

(72) Inventors: Christophe Grumel, Lans en Vercors (FR); Frederic Brasme, Le Bourg D'oisans (FR); Nathalie Le Grand, Le Versoud (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 106 days.

(21) Appl. No.: 16/138,131

(22) Filed: Sep. 21, 2018

(65) Prior Publication Data

US 2019/0113547 A1    Apr. 18, 2019

(30) Foreign Application Priority Data

Oct. 16, 2017   (FR) ..................... 17 59659

(51) Int. Cl.
*G01R 19/00* (2006.01)
*G01R 15/14* (2006.01)
(Continued)

(52) U.S. Cl.
CPC ......... *G01R 19/0092* (2013.01); *G01R 15/14* (2013.01); *H01F 38/30* (2013.01);
(Continued)

(58) Field of Classification Search
CPC ................ G01R 19/00; G01R 19/0084; G01R 19/0092; G01R 15/00; G01R 15/12;
(Continued)

(56) References Cited

U.S. PATENT DOCUMENTS 8,023,235 B2 *  9/2011 Bilac ................... H02H 1/0015
                                                        324/500
9,081,041 B2 *  7/2015 Friedrich ............. G01R 15/207
(Continued)

FOREIGN PATENT DOCUMENTS

EP    0 926 695 A1    6/1999
EP    1 475 874 A1    11/2004
(Continued)

OTHER PUBLICATIONS

French Preliminary Search Report dated Jul. 25, 2018 in French Application 17 59659 filed on Oct. 16, 2017 (with English Translation of Categories of Cited Documents and Written Opinion).

*Primary Examiner* — Hoai-An D. Nguyen
(74) *Attorney, Agent, or Firm* — Oblon, McClelland, Maier & Neustadt, L.L.P.

(57) ABSTRACT

A current measurement device including current sensors positioned around current conductors in order to form a passage for the current conductors along an axis oriented in a first direction and a differential current sensor positioned around the set of current conductors in order to form a common passage for the current conductors along an axis oriented in a second direction. The current sensors and the differential current sensor are located in spaces that are separated by an interface plane. A method for manufacturing such a current measurement device, to a protection module and a differential circuit breaker including such a device.

12 Claims, 11 Drawing Sheets

(51) Int. Cl.
*H01F 38/30* (2006.01)
*H01H 71/12* (2006.01)
*H01H 83/14* (2006.01)
*H02H 1/00* (2006.01)
*H02H 7/26* (2006.01)
*H02H 3/08* (2006.01)
*H01H 83/22* (2006.01)

(52) U.S. Cl.
CPC ........ *H01H 71/125* (2013.01); *H01H 83/144* (2013.01); *H02H 1/0015* (2013.01); *H02H 3/08* (2013.01); *H02H 7/263* (2013.01); *H01F 2038/305* (2013.01); *H01H 83/226* (2013.01)

(58) Field of Classification Search
CPC .... G01R 15/14; G01R 15/142; G01R 15/144; G01R 15/146; G01R 33/00; G01R 33/007; G01R 33/0082; G01R 33/02; G01R 33/06; G01R 33/07; G01R 33/09; H01F 38/00; H01F 38/20; H01F 38/22; H01F 38/28; H01F 38/30; H01F 2038/305; H01H 71/00; H01H 71/10; H01H 71/12; H01H 71/123; H01H 71/125; H01H 83/00; H01H 83/14; H01H 83/144; H01H 83/20; H01H 83/22; H01H 83/226; H02H 1/00; H02H 1/0007; H02H 1/0015; H02H 3/00; H02H 3/08; H02H 7/00; H02H 7/26; H02H 7/261; H02H 7/263
USPC ..... 324/76.11, 117 R, 117 H, 415, 418, 424, 324/500, 508, 509, 512, 522, 537, 539, 324/541, 543, 544, 555, 600, 649, 691, 324/713, 718
See application file for complete search history.

(56) References Cited

U.S. PATENT DOCUMENTS

| | | | |
|---|---|---|---|
| 2005/0162788 A1* | 7/2005 | Boudaud | H02H 3/006 361/42 |
| 2006/0290454 A1 | 12/2006 | Mas et al. | |
| 2011/0040506 A1* | 2/2011 | Schalk | H01H 71/125 702/64 |
| 2011/0187348 A1 | 8/2011 | Soneda et al. | |
| 2013/0265037 A1* | 10/2013 | Friedrich | G01R 33/07 324/207.2 |
| 2015/0309104 A1* | 10/2015 | Moll | G01R 31/50 324/537 |
| 2016/0195575 A1 | 7/2016 | Soneda et al. | |
| 2018/0181181 A1* | 6/2018 | Dickey | G06F 1/305 |

FOREIGN PATENT DOCUMENTS

| | | |
|---|---|---|
| EP | 1 736 784 A1 | 12/2006 |
| EP | 2 355 265 A2 | 8/2011 |
| EP | 2 466 611 A1 | 6/2012 |
| EP | 2 648 010 A1 | 10/2013 |
| FR | 2 938 129 A1 | 5/2010 |
| JP | 7-105822 | 4/1995 |
| JP | 10-98806 | 4/1998 |
| KR | 10-1665952 | 10/2016 |

* cited by examiner

CURRENT MEASUREMENT DEVICE, MANUFACTURING METHOD, PROTECTION MODULE AND DIFFERENTIAL CIRCUIT BREAKER INCLUDING SUCH A DEVICE

TECHNICAL FIELD

The present invention relates to a device intended for measuring the current flowing through electrical lines and for measuring a differential current. The invention also relates to a method for manufacturing the current measurement device. The invention also relates to a module for protection from electrical faults and a differential circuit breaker including such a current measurement device.

PRIOR ART

Devices for protection from fault currents find very wide use in electrical installations supplied with power by lines of an AC network. The function thereof is to detect any fault current, regardless of whether it is linked to an overcurrent in one of the lines or to an insulation fault resulting in a current leakage to ground. These protection devices include a current measurement function so as to detect any threshold crossing and a function for opening the electrical circuit so as to remove the fault. Generally, when only the function of measuring the current flowing through the lines is required, it is grouped together with the function for opening the electric circuit in one and the same unit. However, when the detection of ground leakage current is also required, multiple difficulties arise: measuring the current flowing through the lines requires one sensor per line, while measuring the ground leakage current, also referred to as the differential current, requires a sensor for calculating the vector sum of all of the currents flowing through all of the current lines. The routing of the current conductors becomes complicated, and the need to provide insulation between the conductors and the need for production on an industrial scale at an acceptable cost exacerbate the construction difficulties.

A first means for solving these problems lies in carrying out the function of measuring the differential current by means of a first, separate product and in carrying out the function of measuring the current flowing through the lines and the function of opening the circuit by means of a second product. For example, the document US 2011/0116197 A1 describes a differential current measurement device incorporated within a separate product. The document FR 2 772 979 B1 discloses a differential block that can be connected to the side of a circuit breaker. However, incorporating a function for opening the circuit, sensors for measuring the currents flowing through the lines and a sensor for detecting the differential current within a single device is economically advantageous by virtue of the smaller number of housings and of connection terminals. Additionally, it is very advantageous for the footprint of the product to be similar to that of a protection device without differential protection: this simplifies installation on an electrical switchboard, with all of the equipment being aligned, and the connections are simpler, in particular in the case of connection by means of rigid copper busbars. Lastly, decreasing the footprint allows the user to install a larger number of units on an electrical switchboard.

The document JP 2011-34714 A discloses a differential circuit breaker incorporating current sensors 6 for measuring the currents flowing through the lines and a sensor 7 for detecting the differential current. The sensor 7 is placed in the extension of the current sensors 6, which increases the length of the housing and changes its size with respect to a circuit breaker not having a differential function. Additionally, the oblong shape of the differential current sensor 7 makes the sensor 7 sensitive to the current flowing through the lines 50 and the accuracy of the differential current measurement may be negatively affected when the current flowing through the lines becomes substantial.

The document JPH0878259 A describes a three-phase differential circuit breaker employing only two sensors 11U and 11W for measuring the currents flowing through the lines 32U and 32W and a differential current sensor 33. An evaluation of the current flowing through the line 32V is obtained by calculating the vector sum of the currents flowing through the lines 32U and 32W. This solution obviously decreases the amount of space occupied and simplifies production but calculating the current in the phase 32V accumulates errors in the measurement of the currents flowing through the lines 32U and 32W and must take into account the differential current that is present. This solution is advantageous in the context of ground fault protection but it is not suitable for differential protection intended for protecting persons, for which the differential current protection threshold is low, for example 30 mA, nor for accurately measuring the current flowing through the phases for the purpose of measuring power or energy.

DISCLOSURE OF THE INVENTION

The present invention aims to overcome the drawbacks presented by the prior art documents. More particularly, the present invention describes a compact device making it possible to measure the current flowing through each electrical line and to measure the differential current. This device may be incorporated within a module for protection from overvoltages for the purpose of providing differential protection and thus allowing a conventional circuit breaker to be turned into a differential circuit breaker simply by changing the protection module, without negatively affecting the footprint of the circuit breaker. This aspect is very advantageous for the user.

To this end, the current measurement device is arranged so as to be incorporated within a substantially parallelepipedal housing including an upstream face opposite a downstream face, a front face opposite a back face, and a first lateral face opposite a second lateral face, said current measurement device including:

- at least two upstream connection lugs, which lugs are intended to be electrically connected to connection lugs of an electric current breaking device for protecting at least two electrical lines;
- at least two downstream connection lugs, which lugs are intended to be electrically connected to operating terminals;
- at least two current conductors, each current conductor being arranged so as to electrically link an upstream connection lug to a downstream connection lug, respectively;
- at least two current sensors, each current sensor being positioned around a respective current conductor so as to form a respective passage for the current conductor along an axis oriented in a first direction in the upstream face-downstream face direction; and
- a differential current sensor, said current measurement device being such that the differential current sensor is positioned around the set of the at least two current conductors so as to form a common passage for the current conductors along an axis oriented in a second direction in the front face-back face direction.

Preferably, the current sensors and the differential current sensor are respectively embedded in spaces that are superposed between the front face and the back face, such that:
the current sensors are positioned in a first space of the housing, said first space being delimited by the front face, the first lateral face, the second lateral face, the upstream face, the downstream face, and an interface plane that is located between the front face and the back face; and
the differential current sensor is positioned in a second space of the housing, said second space being delimited by the interface plane, the first lateral face, the second lateral face, the upstream face, the downstream face and the back face.

Preferably, the upstream connection lugs are located level with the second space of the housing.

Preferably, the downstream connection lugs are located level with the first space of the housing.

Advantageously, each upstream connection lug is aligned along an axis that is oriented in the first direction with each respective downstream connection lug to which said upstream connection lug is linked by a respective current conductor.

Preferably, each current conductor is composed of three portions:
a first conductor portion that is electrically connected, by a first of its ends, to the upstream connection lug, said first conductor portion being arranged so as to pass through the common passage through the differential current sensor and arranged so as to be electrically connected, by a second of its ends, to a first end of a second conductor portion;
the second conductor portion of rectangular section that is electrically connected, by a first of its ends, to the second end of the first conductor portion, said first end being positioned substantially in the interface plane, and bent at a second of its ends to form a flat lug that is oriented in a plane perpendicular to the first direction; and
a third conductor portion that is electrically connected, by a first of its ends, to the flat lug formed by the second end of the second conductor portion, said third conductor portion being arranged so as to pass through the passage through a current sensor and arranged so as to be electrically connected, by a second of its ends, to the downstream connection lug.

In one particular embodiment, each third conductor portion passes through the passage through the current sensor that surrounds it at least twice, forming a loop.

Preferably, the section of the first, second and third portions of each conductor is substantially identical in terms of area.

Preferably, the current measurement device such as described above is intended to measure the currents flowing through three phase lines and one neutral line of a three-phase electrical network, and includes a first, a second and a third current sensor, each current sensor being intended to measure a current flowing through each of the phases, and includes a fourth current sensor, intended to measure a current in the neutral line, which fourth current sensor is positioned around a neutral conductor so as to form a passage for the current conductor along an axis oriented in a third direction in a first lateral face-second lateral face direction.

The invention also relates to a method for manufacturing a current measurement device such as described above, said method including the following steps:

welding each first end of each second conductor portion to each second end of each first conductor portion so as to form a segment of each current conductor;
depositing an insulating coating on each conductor segment so as to electrically insulate each conductor segment, first and second ends of each of said conductor segments being left free of coating for the purpose of later welding;
welding each downstream connection lug to each second end of each third portion, respectively;
passing each third portion of each of the conductors through the passage formed by the respective current sensor;
selecting a single or double pass-through production variant and, in the case of a double pass-through:
a step of bending the third portions of the current conductors so as to form a loop around each respective sensor; and
passing each third portion of each of the conductors through the passage a second time;
welding each first end of each third portion to each segment at the second end of the second portions, respectively;
passing the first ends of the conductor segments through the common passage formed by the differential current sensor;
welding each upstream connection lug to each first end of each conductor segment, respectively; and
positioning a brace for holding the first ends of the first portions in a predefined position.

Another subject of the invention is a module for protection from electrical faults that is intended to cooperate with an electric current breaking device, said protection module including:
a processing unit;
an actuator for actuating the electric current breaking device; and
an adjustment device that is linked to the processing unit, said adjustment device being arranged so as to adjust at least a first trip threshold and/or a second trip threshold;
a current measurement device such as described above and including:
at least two current sensors;
a differential current sensor; and
at least two current conductors that are electrically linked to upstream lugs and downstream lugs,
the processing unit being connected to the current sensors and to the differential current sensor so as to form:
at least one measurement of the current flowing through each of the current conductors; and
a measurement of the differential current across all of the current conductors, the processing unit being arranged so as to activate the actuator to actuate the electric current breaking device when at least one current measurement or when the current measurement is higher than the first trip threshold or when the measurement of the differential current is higher than the second trip threshold.

The invention also relates to a differential circuit breaker intended to protect an electrical circuit including at least two electrical lines from electrical faults, said circuit breaker including:
at least two upstream connection terminals for connecting at least the two electrical lines;
at least two internal connection terminals; and
an electric current breaking device;
a module for protection from electrical faults such as described above, and such that:
the electric current breaking device is connected between the at least two upstream connection terminals and the at least two internal connection terminals, said electric current breaking device including contacts allowing the current flowing between the at least two upstream connection terminals and the at least two internal connection terminals to be established or interrupted;

the at least two internal connection terminals being connected to the at least two upstream lugs of the protection module;

the electric current breaking device of the differential circuit breaker being connected and arranged so as to receive and to execute a command transmitted by an actuator of the protection module.

BRIEF DESCRIPTION OF THE DRAWINGS

Other advantages and features will become more clearly apparent from the following description of particular embodiments of the invention, which are given by way of nonlimiting examples and shown in the appended drawings, in which.

DETAILED DESCRIPTION OF PREFERRED EMBODIMENTS

The current measurement device 1 is preferably intended for the measurement of current in an electrical installation supplied with power by a three-phase network including a neutral line, but may also be used on any electrical network including at least two phases or at least one phase and a neutral. The device makes it possible to measure the current flowing through the electrical lines and to measure a differential current.

Figure 1:
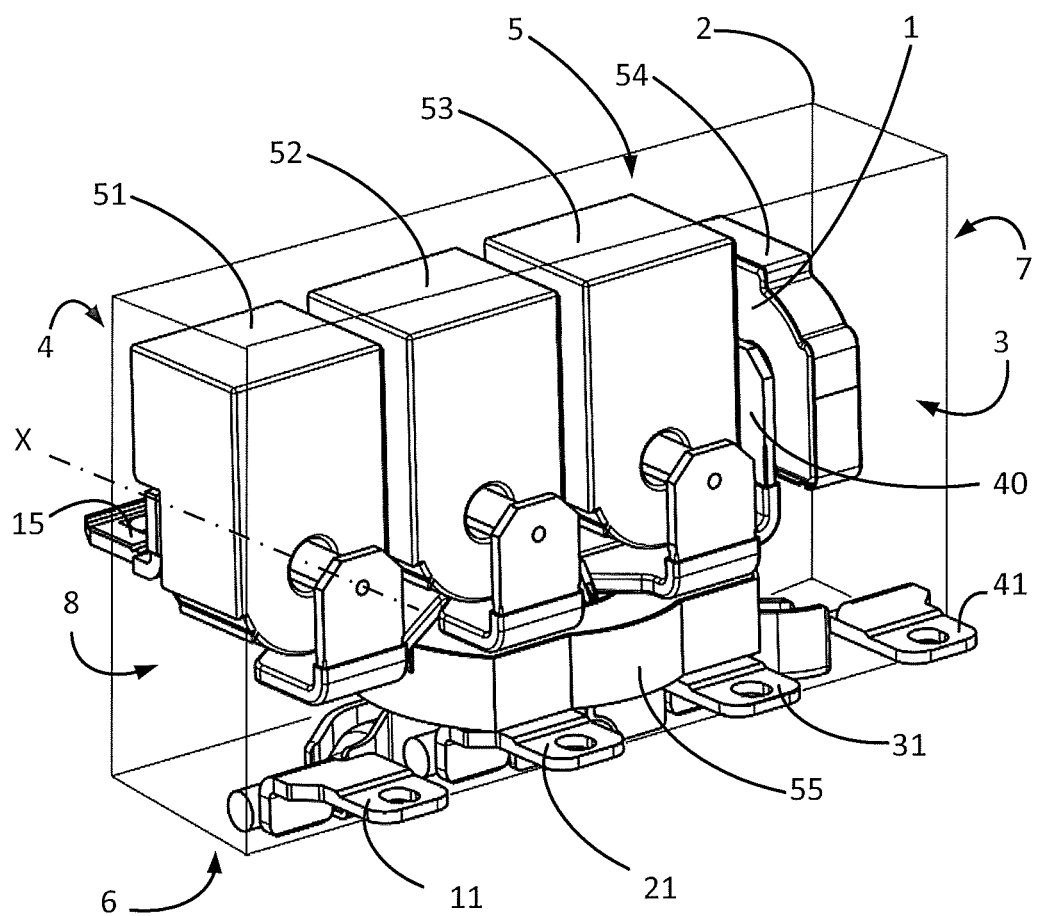
FIG. 1 shows a perspective view of a current measurement device intended for a three-phase network with distributed neutral according to one preferred embodiment.

FIG. 1 shows a perspective view of the current measurement device 1 according to one preferred embodiment. The current measurement device 1 is arranged so as to be incorporated within a substantially parallelepipedal housing 2 including an upstream face 3 opposite a downstream face 4, a front face 5 opposite a back face 6, and a first lateral face 7 opposite a second lateral face 8. The front face 5 is preferably oriented towards the user. The current measurement device 1 includes:

upstream connection lugs 11, 21, 31, 41 for connection to an electric current breaking device that is located upstream in an electrical circuit, these lugs being positioned on the upstream face side 3;

downstream connection lugs 15, 25, 35, 45, for connection to operating terminals that are intended to provide an electrical connection to electrical loads, these lugs being positioned on the downstream face side 4;

current conductors 10, 20, 30, 40 for providing an electrical connection between the upstream connection lugs 11, 21, 31, 41 and the downstream connection lugs 15, 25, 35, 45, respectively;

current sensors 51, 52, 53 and 54, each sensor surrounding a current conductor so as to measure the current flowing through said current conductor; and a differential current sensor 55 surrounding all of the current conductors so as to measure the differential current, i.e. the result of the vector sum of the currents flowing through all of the current conductors. A nonzero differential current corresponds to a current leakage generally looping back via a protective conductor.

According to the preferred embodiment illustrated in FIG. 1, the current measurement device 1 is intended to be connected to a three-phase network with a distributed neutral line, the neutral line having to be connected to the upstream connection lug 41, the connection of the neutral on the downstream side for the user having to be made to the downstream connection lug 45.

Figure 2:
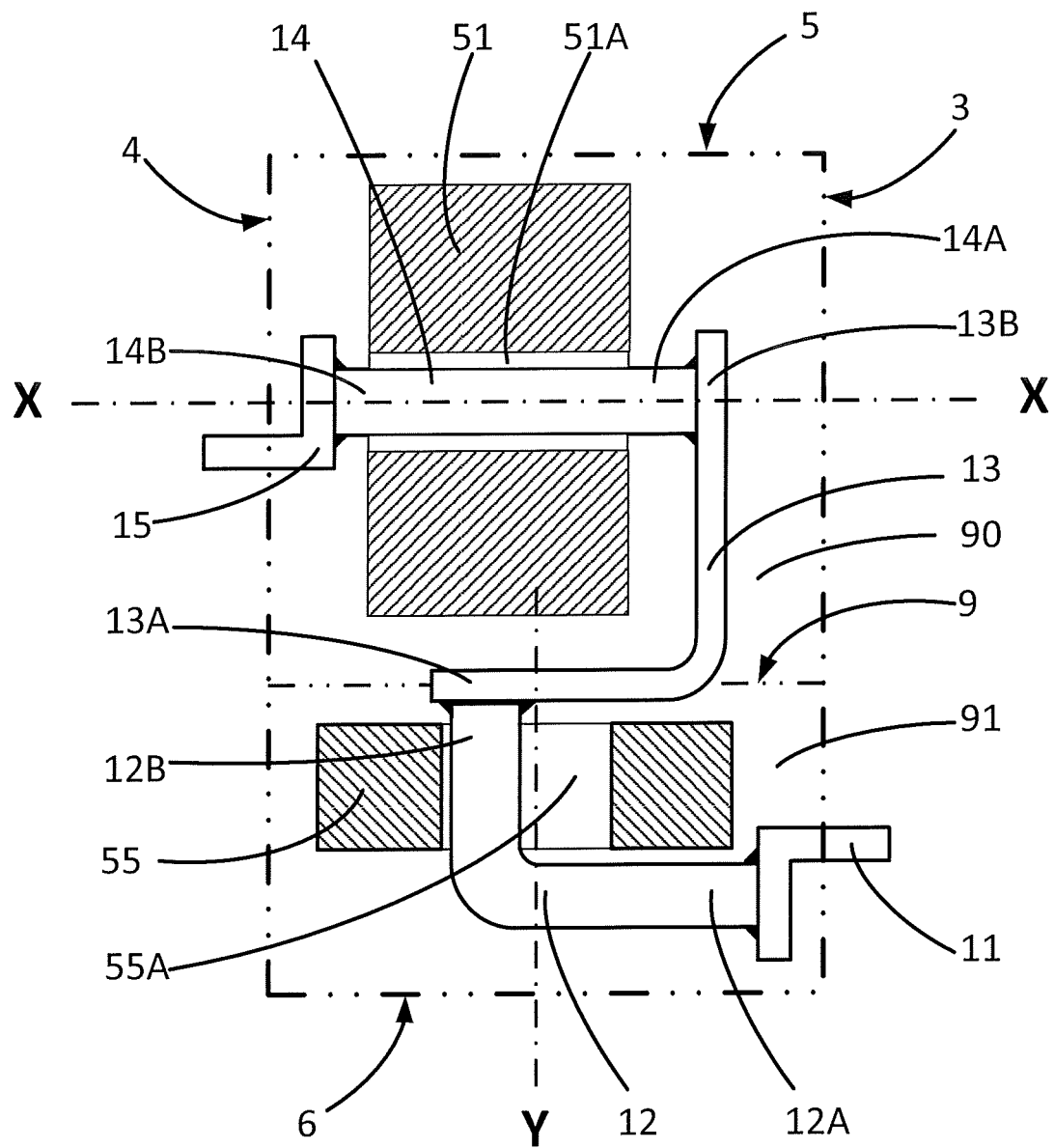
FIG. 2 is a schematic representation of a current conductor in a phase of the measurement device showing one arrangement of the connection lugs, of the various portions of the current conductor and of a plurality of sensors.

The current sensors 51, 52 and 53 are positioned around a respective current conductor 10, 20 and 30 so as to form a respective passage for the current conductor along an axis oriented in a first direction X in the upstream face 3-downstream face 4 direction. To produce a compact current measurement device, the differential current sensor 55 is positioned around all of the current conductors 10, 20, 30, 40 so as to form a common passage 55A along an axis oriented in a second direction Y in the front face 5-back face 6 direction. To clearly show the first direction X and the second direction Y, FIG. 2 shows an arrangement of the upstream connection lug 11, of the current conductor 10, of the differential current sensor 55, of the current sensor 51 and of the downstream lug 15. The current conductor 10 is composed of three portions:

a first portion 12 that is mechanically and electrically connected, preferably by welding, by a first of its ends 12A to the upstream connection lug 11;

a second portion 13 that is mechanically and electrically connected, preferably by welding, by a first of its ends 13A to the second end 12B of the first portion 12; and a third portion 14 that is mechanically and electrically connected, preferably by welding, by a first of its ends 14A to the second end 13B of the second portion 13 and mechanically and electrically connected, by a second of its ends 14B, to the downstream connection lug 15.

The first portion 12 forms a bend between its two ends 12A and 12B. The differential current sensor 55 forms a passage 55A through which the second end 12B of the first portion 12 of the current conductor 10 passes. The passage 55A is oriented along an axis that is oriented in the second direction Y, in the front face 5-back face 6 direction. The third portion 14 of the current conductor 10 passes through the passage 51A formed by the current sensor 51 along an axis that is oriented in the first direction X in the upstream face 3-downstream face 4 direction. The axis that is oriented in the first direction X and the axis that is oriented in the second direction Y are substantially orthogonal.

Two spaces 90 and 91 are defined inside the housing 2. A first space 90 is delimited by the front face 5, the first lateral face 7, the second lateral face 8, the upstream face 3, the downstream face 4, and an interface plane 9 that is located between the front face 5 and the back face 6. A second space 91 is formed by the space in the housing 2 not forming part of the first space 90. The second space 91 is delimited by the interface plane 9, the first lateral face 7, the second lateral face 8, the upstream face 3, the downstream face 4 and the back face 6. The current sensor 51 is located within the first space 90. The differential current sensor 55 is positioned within the second space 91. The interface plane passes through the first end 13A of the second portion 13 of the current conductor 10.

Incorporating the current sensors as described allows incorporation within the housing 2 while minimizing the distance between the front face 5 and the back face 6 and especially the distance between the upstream face 3 and the downstream face 4. Specifically, orienting the differential current sensor 55 in the second direction Y, which is substantially orthogonal to the first direction X, allows the volume occupied by the sensor 55 in the second space 91 to be optimized: said sensor preferably being a toroidal sensor, incorporating said sensor "flat" allows the distance between the interface plane 9 and the back face 6 to be minimized without significantly affecting the distance between the upstream face 3 and the downstream face 4. Furthermore, orienting the current sensor 51 along the axis that is oriented in the first direction X, substantially orthogonal to the second direction Y of the differential current sensor 55, minimizes the effect of the electromagnetic field radiated by the current sensor 51 on the differential current sensor 55.

The upstream connection lug 11 is located level with the second space 91 in the housing 2. This arrangement, in association with the "flat" incorporation of the differential current sensor 55, contributes to the compactness of the measurement device 1 by limiting the length and the complexity of the first end 12A of the first portion 12. The downstream connection lug 15 is located level with the first space 90 in the housing. The upstream connection lug 11 is aligned, in the first direction X, with the downstream connection lug 15.

The first conductor portion 12 preferably consists of a solid electrical conductor of substantially circular section having a diameter of 5 mm. This portion may also be produced by means of an electrical conductor of rectangular or square section, or else by means of a braided conductor or any other electrically conductive linkage that is able to follow a tight radius of curvature between the ends 12A and 12B. The end 12B is mechanically and electrically connected to the first end 13A of the second conductor portion 13.

The second conductor portion 13 is preferably of rectangular section and forms a right-angled bend between the ends 13A and 13B. The first end 13A is positioned substantially in the interface plane 9. The second end 13B forms a flat lug that is oriented in a plane perpendicular to the first direction X so as be connected to the first end 14A of the third conductor portion 14. The section of the second portion is preferably equal to 12 mm in width and 2 mm in thickness. The second portion may also be produced by means of a solid electrical conductor of circular, oval or square section or else by means of a braided conductor.

The third portion preferably consists of a solid electrical conductor, preferably of circular section having a diameter of 5 mm. The third portion passes through the passage 51A formed by the current sensor 51 along an axis that is oriented in the first direction X. This third portion may also be produced by means of a solid electrical conductor of rectangular or square section, or else by means of a braided conductor.

The various portions are preferably connected by means of welding or brazing, providing the current conductor 10 with a high degree of mechanical rigidity and excellent electrical conductivity. Using a rectangular section of low thickness for the second portion and more particularly for the first end 13A makes it possible to minimize the distance between the front face 5 and the back face 6. Specifically, this feature allows the sensor 51 to be brought closer to the sensor 55 in the second direction Y as shown clearly in FIG. 2. As a variant, according to the same principle, it is possible to further minimize the distance between the front face 5 and the back face 6 by using one and the same rectangular section of low thickness for the first end of the first portion 12A. The described technical features relating to the current conductor 10, such as shown in FIG. 2, are identical for the current conductors 20 and 30, the lengths of the portions of the conductors differing according to the current conductor.

Figure 3:
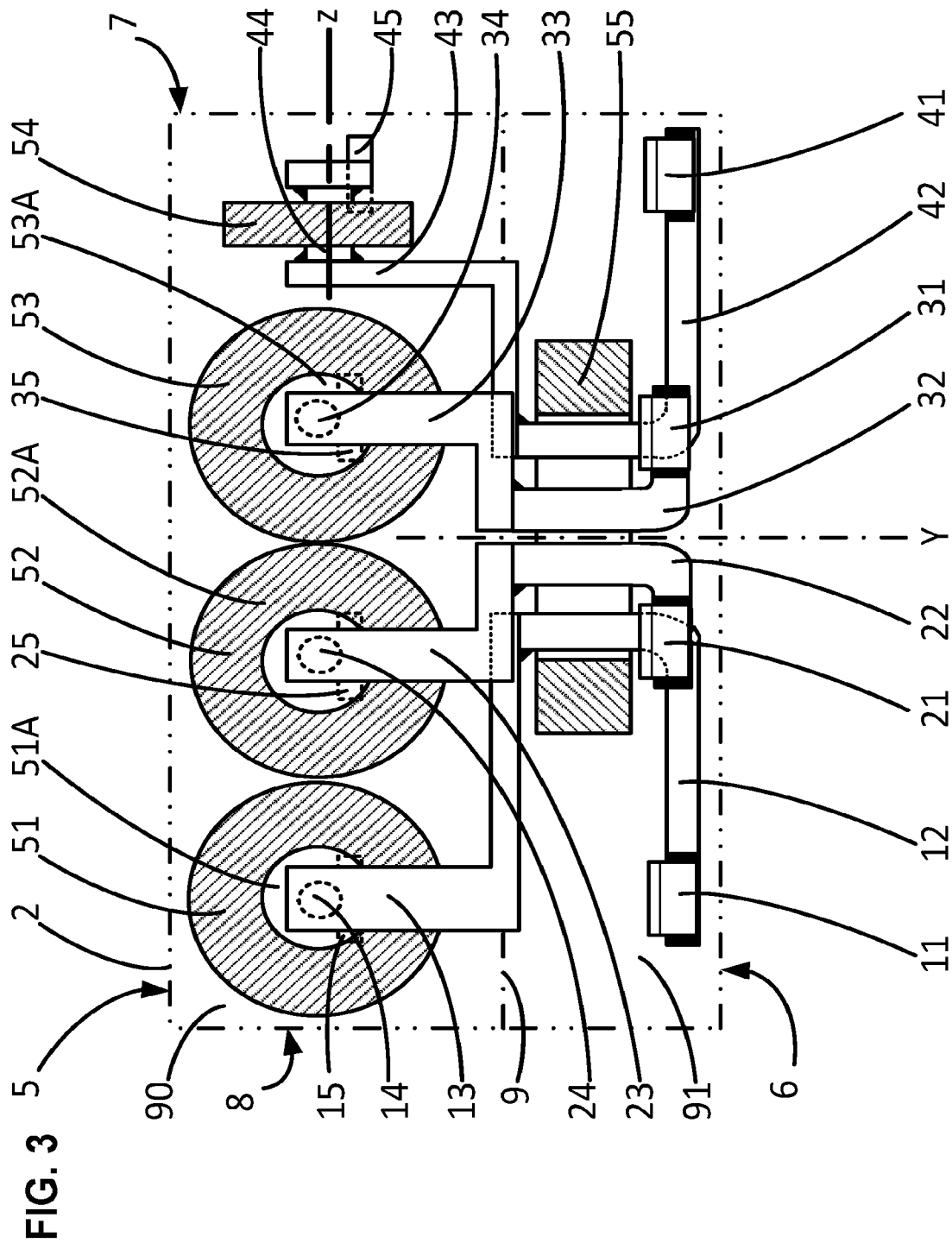
FIG. 3 is a schematic representation of the arrangement of the measurement device intended for a three-phase network with distributed neutral according to one preferred embodiment.

FIG. 3 shows the measurement device, in a right lateral face-left lateral face direction, showing one arrangement of the connection lugs according to the preferred embodiment of the invention, i.e. for a current measurement device 1 intended for use on a three-phase electrical network with distributed neutral. The upstream connection lugs 21 and 31 of the current conductors 20 and 30 are located level with the second space 91 in the housing 2. The downstream connection lugs 25 and 35 are located level with the first space 90 in the housing 2. The current conductors 20 and 30 include a first portion 22 and 32, respectively, which preferably consists of a solid electrical conductor. The first ends of the first portions 22 and 32 are electrically linked to the upstream connection lugs 21 and 31, respectively. The second ends of the first portions 22 and 32 are mechanically and electrically connected to the first ends 23A and 33A, respectively, of the second conductor portions 23 and 33. The second conductor portions 23 and 33 are of rectangular section and form a right-angled bend between the ends 23A and 23B and 33A and 33B, respectively. The first ends 23A and 33A are positioned substantially in the interface plane. The second ends 23B and 33B form a flat lug that is oriented in a plane perpendicular to the first direction X so as to be connected to the first ends 24A and 34A, respectively, of the third conductor portions 24 and 34.

The third conductor portions 24 and 34 are preferably of circular section and pass through the passages 52A and 53A, respectively, formed by the current sensors 52 and 53 along an axis that is oriented in the first direction X.

In the same way as for the conductor 10, the various portions of the current conductors 20 and 30 are preferably connected by means of welding or brazing. The first portions 12, 22, 32 of the conductors 10, 20, 30, respectively, form a bend between their respective ends. The differential current sensor 55 forms a passage 55A through which the second ends 12B, 22B, 32B pass along an axis that is oriented in the second direction Y, in the front face 5-back face 6 direction. The third conductor portions 14, 24 and 34 are parallel to one another. The second ends 13B, 23B, 33B of the second portions 13, 23, 33 are positioned in one and the same plane.

Figure 4:
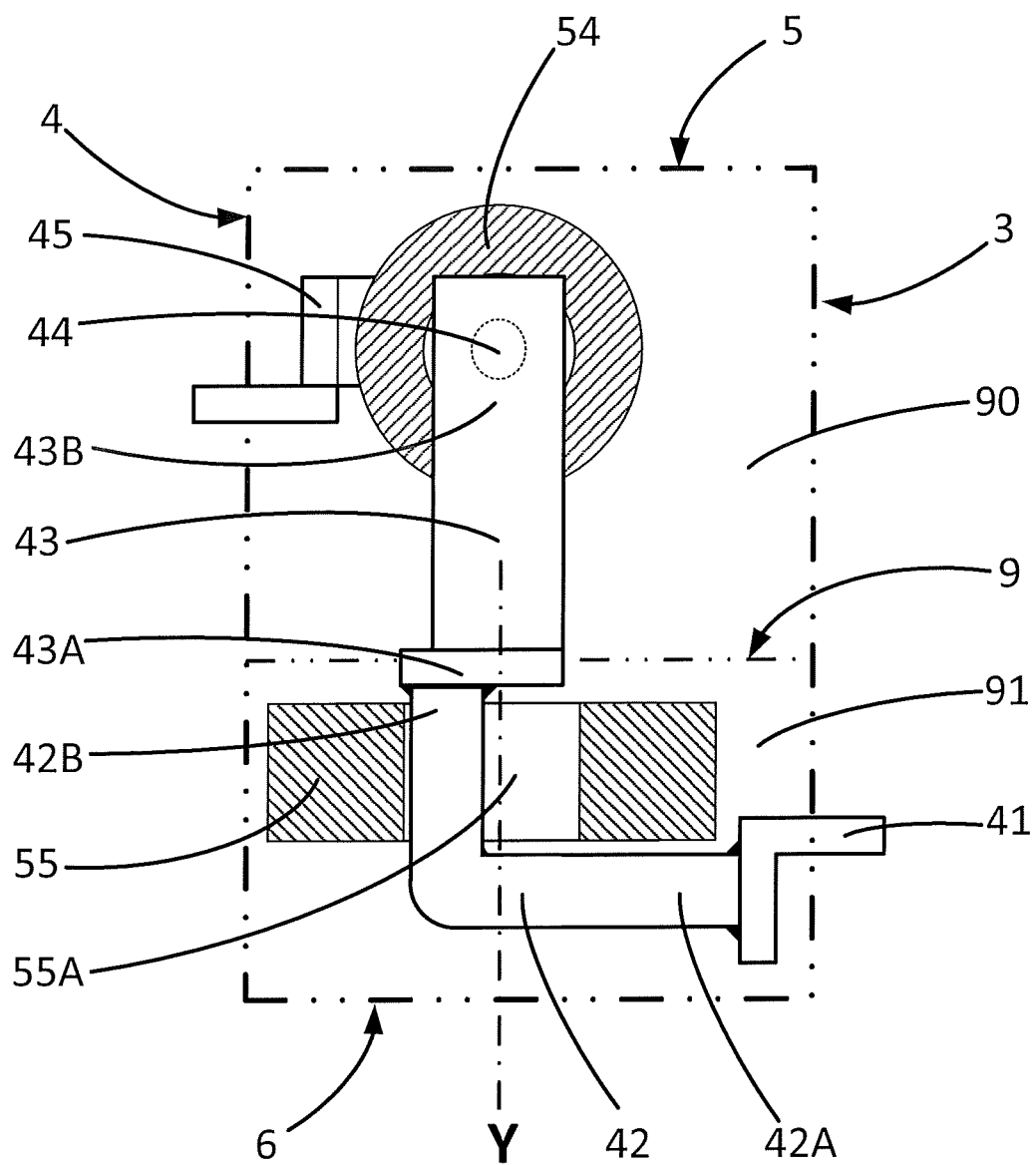
FIG. 4 is a schematic representation of a neutral current conductor of the measurement device showing one arrangement of connection lugs, of various portions of the current conductor and of a plurality of sensors.

The current conductor 40 is preferably intended for the measurement of the current in the neutral line. In supplement to FIG. 3, FIG. 4 schematically shows, in an upstream face-downstream face direction, the arrangement of the upstream 41 and downstream 45 connection lugs, of the current conductor 40 and of the current sensors 54 and 55 so as to show the particularities of said current conductor with respect to the other current conductors 10, 20 and 30. The current conductor 40 provides the electrical connection between the upstream connection lug 41 and the downstream connection lug 45. The current conductor 40 consists of three portions: a first portion 42, a second portion 43 and a third portion 44. The first conductor portion 42 consists of a preferably solid conductor, in the same way as the first portions of the conductors 10, 20 and 30. The first portion 42 forms a bend between its two ends 42A and 42B. The differential current sensor 55 forms a passage 55A through which the second end 42B of the first portion 42 of the current conductor 40 passes. The second conductor portion 43 is of rectangular section and forms a right-angled bend between the ends 43A and 43B. The first end 43A is positioned substantially in the interface plane 9 and connected to the second end 42B of the first portion 42. The second end 43B of the second portion 43 forms a flat lug that is oriented in a plane parallel to the first direction X so as be connected to a first end 44A of the third conductor portion 44. The fourth current sensor 54 is positioned around the third, neutral conductor portion 44 so as to form a passage for the current conductor 54A along an axis that is oriented in a third direction Z, in a first lateral face 7-second lateral face 8 direction. The downstream connection lug 45 is connected to a second end 44B of the third, neutral conductor portion 44. Said connection lug 45 is bent in the first direction X so as to be connected to the second end 44B, then in the third direction Z so as to be oriented in the same plane as the other downstream connection lugs 15, 25 and 35. The current sensor 54, intended for measuring the current in the neutral line, is preferably smaller in size than the current sensors 51, 52 and 53. Orienting the passage for the current conductor 54A in the third direction Z allows a space to be made between the sensor 54 and the first lateral face 7 that can be used, for example, for incorporating electronic boards.

Figure 5:
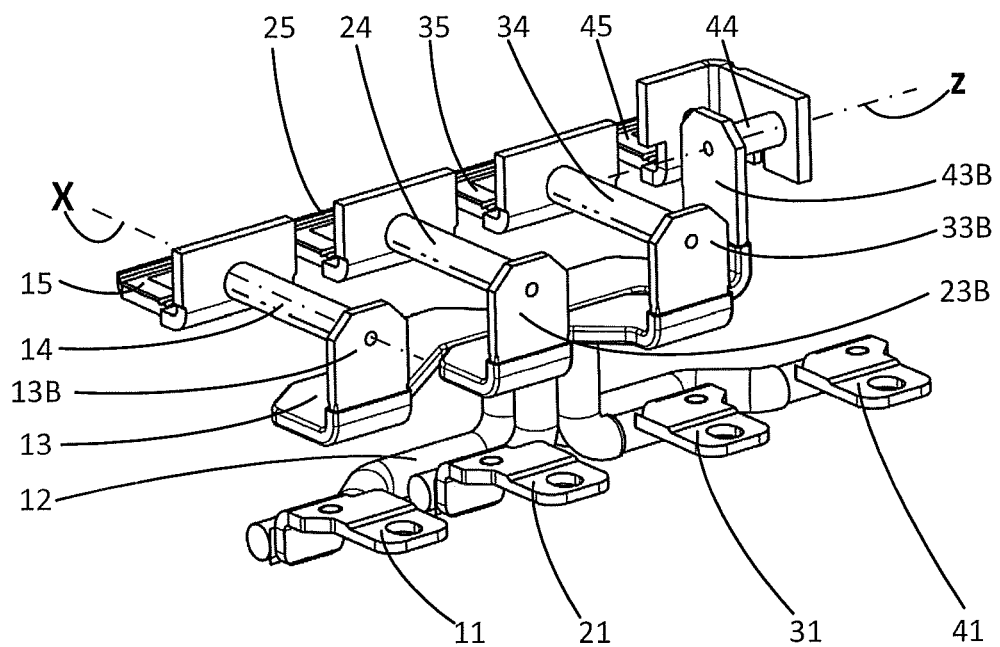
FIG. 5 shows a perspective view of the current measurement device, seen from the same angle as in FIG. 1, the device not showing any current sensors so as to clearly show the arrangement of the current conductors.

FIG. 5 shows a perspective view of the current measurement device, seen from the same angle as in FIG. 1, the device not showing any current sensors so as to clearly show the arrangement of the current conductors and the first direction X and the third direction Z.

Figure 6:
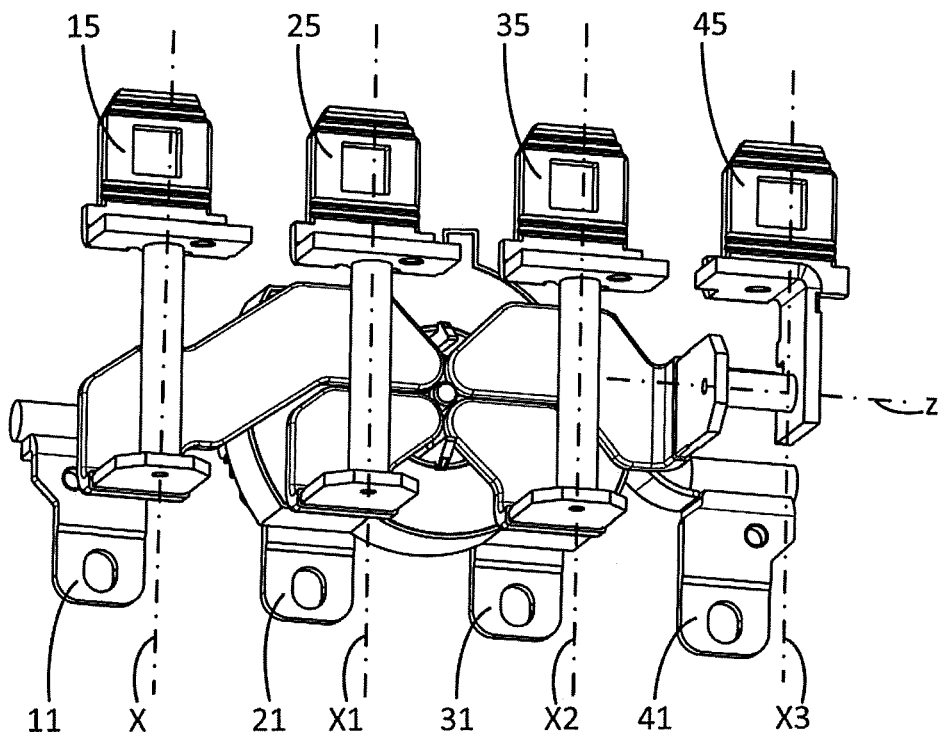
FIG. 6 shows a perspective view of the current measurement device for the purpose of illustrating an alignment between connection lugs.

FIG. 6 shows a perspective view of the current measurement device for the purpose of illustrating an alignment between the upstream connection lugs 11, 21, 31, 41 and the downstream connection lugs 15, 25, 35, 45, respectively. Each upstream connection lug 11, 21, 31, 41 is aligned along an axis that is oriented in the first direction X with each respective downstream connection lug 15, 25, 35, 45 to which it is linked by a respective current conductor 10, 20, 30, 40. Thus, in FIG. 6, the lugs 11 and 15 are aligned along an axis that is oriented in the first direction X, the lugs 21 and 15 are aligned along an axis X1 that is oriented in the first direction X, the lugs 31 and 15 are aligned along an axis X2 that is oriented in the first direction X and the lugs 41 and 45 are aligned along an axis X3 that is oriented in the first direction X. The axes X, X1, X2 and X3 are parallel to one another. Preferably, the first direction X is parallel to the first lateral face 7 or to the second lateral face 8. This feature makes it possible to have the same interaxial distance, also referred to as the connection "pitch", between consecutive upstream connection lugs 11, 21, 31, 41 and between consecutive downstream connection lugs 15, 25, 35, 45. Interchangeability of current measurement devices 1 having adjustable functions or performance levels, or else association with breaking devices 71 having different technical performance levels, is thus facilitated.

Figure 7:
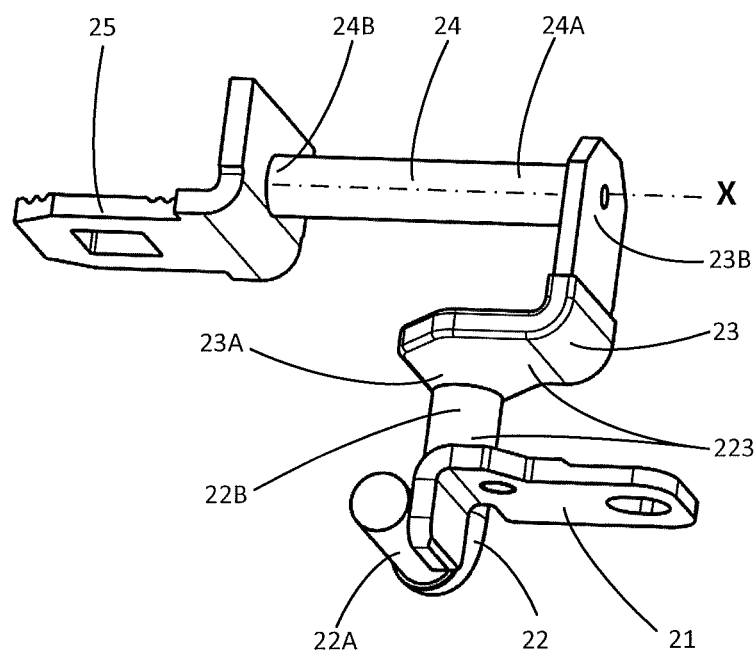
FIG. 7 shows a detailed view, in perspective and according to one preferred embodiment, of a current conductor in a phase of the measurement device, for the purpose of showing the various constituent portions.
Figure 8:
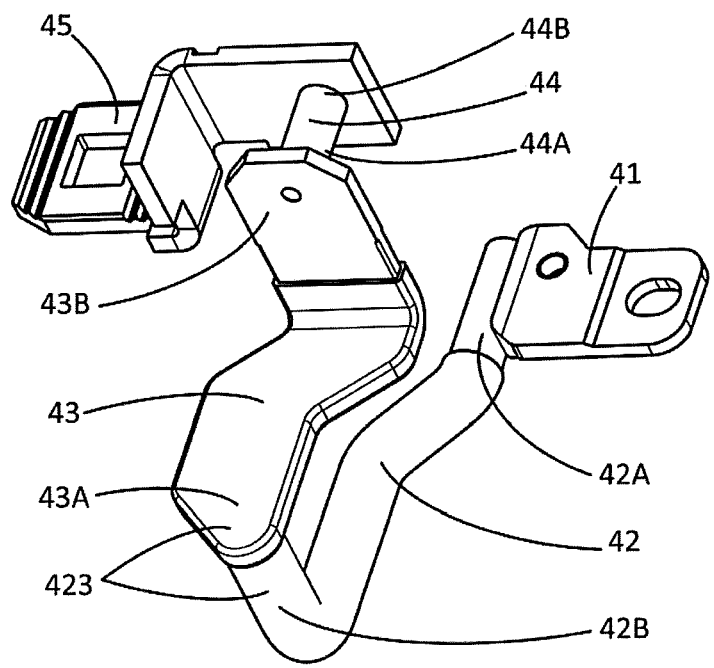
FIG. 8 shows a detailed view, in perspective and according to one preferred embodiment, of a current conductor intended to be connected to a neutral line.

FIG. 7 shows a detailed view, in perspective and according to one preferred embodiment, of the current conductor 20 for the purpose of showing the various constituent portions. FIG. 8 shows a detailed view, in perspective and according to one preferred embodiment, of the conductor 40, intended to be connected to a neutral line of the electrical installation, for the purpose of clearly showing the various constituent portions.

Preferably, the section of the first, second and third portions of each conductor (12, 13, 14, 22, 23, 24, 32, 33 and 34) is substantially identical in area so as to distribute heating along the entire length of each current conductor, thus avoiding the development of hotspots.

Figure 9:
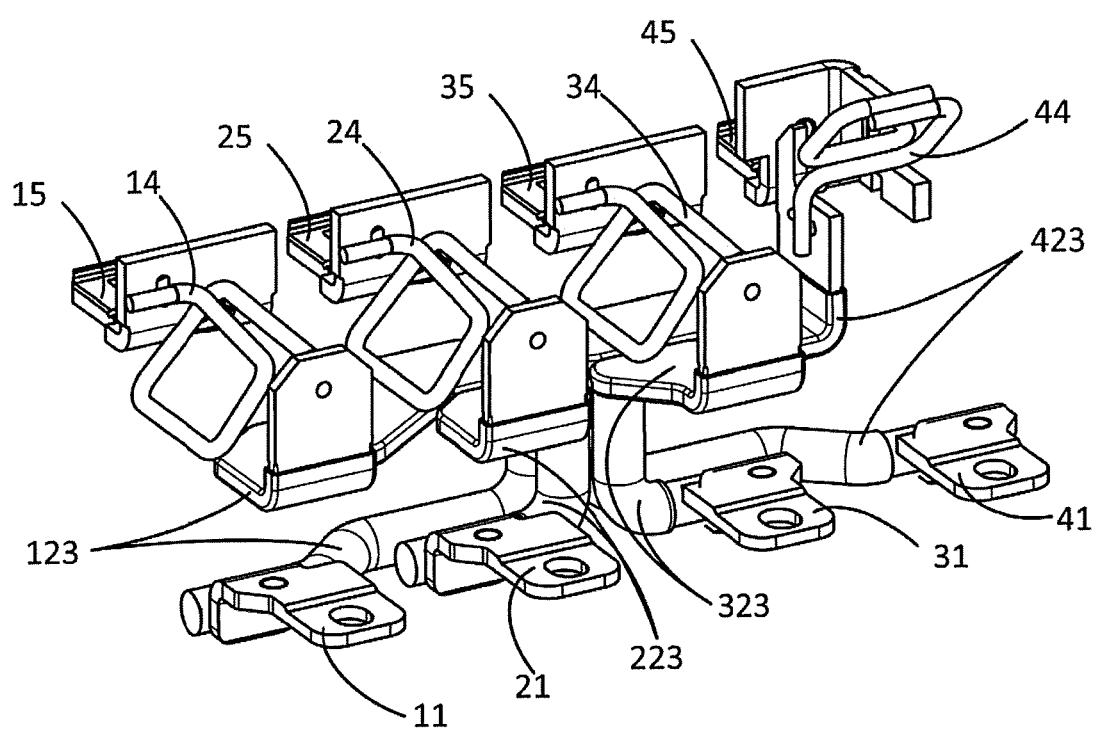
FIG. 9 shows a perspective view of a current measurement device, similar to FIG. 1, for the purpose of illustrating the arrangement of current conductors in the sensors in one variant including a double pass through said sensors, the latter not being shown.

The current measurement device 1 is preferably intended for the measurement of currents flowing through the phases or the neutral that are comprised between 25 amperes and 160 amperes, but it may be adapted for measuring currents of different amplitudes. For example, to measure a current having an amplitude of 25 amperes using current sensors 51, 52, 53 and 54 that are sized for measuring higher currents, it is advantageous to pass each third conductor portion 14, 24, 34, 44 twice through each respective passage 51A, 52A, 53A and 54A formed by each current sensor 51, 52, 53 and 54, respectively. Thus, the signal delivered by the current sensors 51, 52, 53 and 54 is twice as high, thereby increasing the accuracy of the measurement. FIG. 9 shows a perspective view of the current measurement device, similar to FIG. 4, for the purpose of illustrating a double pass-through of the third portions of the current conductors through the sensors. In the case of a nominal measurement rating that is equal to 25 amperes, the section of the third conductor portions 14, 24, 34, 44 may be smaller than for higher ratings. The conductive material, preferably copper or copper-clad steel, used for said third portions is curved to form a loop so as to pass through the passage in the respective current sensor twice. To facilitate production on an industrial scale, the first end 44A and the second end 44B of the third conductor portion 44 are formed separately, arranged with the current sensor 44 so as to pass through the current sensor 44 twice, then the first end 44A and the second end 44B are welded to one another to form the third portion 44.

Figure 10:
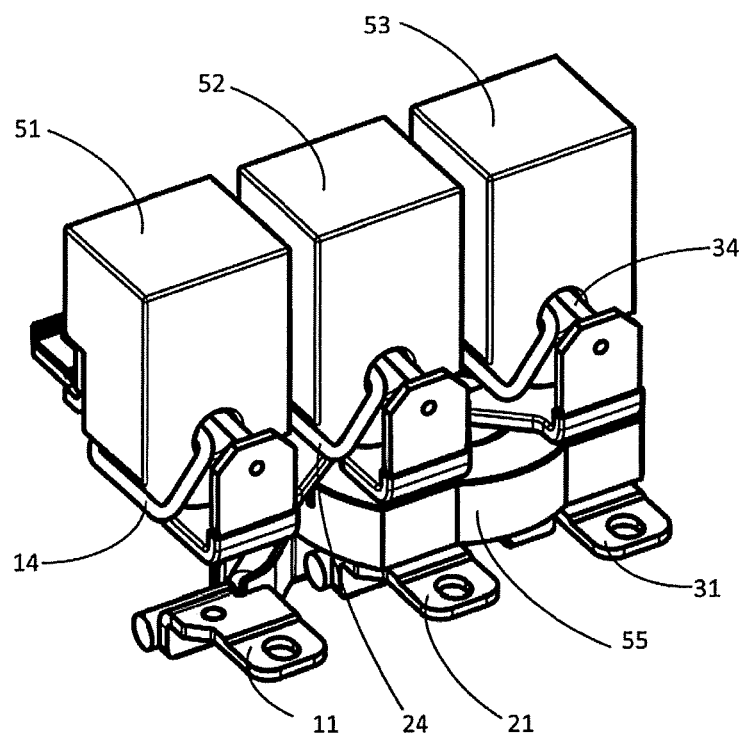
FIG. 10 shows a perspective view of the current measurement device according to a tripolar variant.

The current measurement device may be easily adapted for a tripolar variant: since the neutral line is not distributed, the upstream connection lug 41, the downstream connection lug 45, the current conductor 40 and the current sensor 54 are absent. The differential current sensor 55 forms a passage 55A through which the second ends 12B, 22B, 32B of the current conductors 10, 20 and 30 pass. FIG. 10 shows a perspective view of a tripolar current measurement device including the third portions 14, 24, 34 of the current conductors 10, 20, 30 passing through the sensors 51, 52 and 53 twice.

Figure 11:
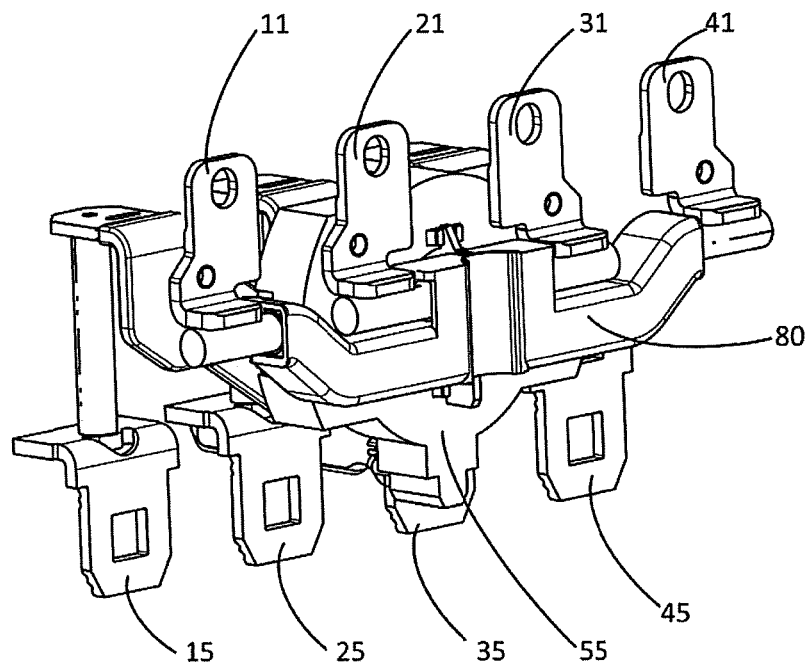
FIG. 11 shows a perspective view of the current measurement device illustrating the use of a brace for holding the current conductors.

To guarantee dielectric strength between the current conductors, the first and second portions of the current conductors 10, 20, 30, 40 are coated with an insulating protective layer, preferably an epoxy coating, after the first and second portions have been assembled. The ends 12A, 22A, 32A, 42A and the ends 13B, 23B, 33B and 43B are left free of insulating coating for the purpose of welding in a manufacturing method. Lastly, a brace 80 made of an insulating material covers the first ends 12A, 22A, 32A, 42A of the first portions so as to hold the current conductors 10, 20, 30, 40 in a predefined position facilitating the handling and assembly of the current measurement device 1 in the housing 2. FIG. 11 shows the measurement device 1 including the brace 80.

The invention also relates to a method for manufacturing a current measurement device 1. Said method, shown in the form of a flowchart in FIG. 12, may be used to manufacture a current measurement device suitable for an electrical network including at least two phases and hence including at least two current conductors 10, 20. For a current measurement device suitable for a three-phase electrical network with neutral, i.e. including four current conductors 10, 20, 30 and 40, the method includes the following steps:

welding 100 the first end 13A of the second conductor portion 13 to the second end 12B of the first conductor portion 12 so as to form a first current conductor segment 123, then, respectively and in the same way, welding the first end 23A, 33A, 43A of each second conductor portion 23, 33, 43 to each second end 22B, 32B, 42B of each first conductor portion 22, 32, 42 so as to form a second, third and fourth segment 223, 323, 423 of each current conductor, respectively;

depositing 110 an insulating coating on each conductor segment 123, 223, 323, 423 so as to provide electrical insulation, the first ends 12A, 22A, 32A, 42A and the second ends 12B, 22B, 32B and 42B of each of said conductor segments being left free of coating for the purpose of later welding;

welding 120 each downstream connection lug 15, 25, 35, 45 to each second end 14B, 24B, 34B, 44B of each third portion 14, 24, 34, 44, respectively;

passing 130 each third portion 14, 24, 34, 44 of each of the conductors respectively through the passage 51A, 52A, 53A and 54A formed by the respective current sensor 51, 52, 53, 54.

The method is suitable for manufacturing a current measurement device 1 including the third portions of the current conductors passing once or twice through the current sensors 51, 52, 53, 54. A selection step 131 selects a single or double pass-through production variant and, in the case of a double pass-through, a step of bending 132 the third portions 14, 24, 34, 44 of the current conductors is carried out so as to form a loop around each respective sensor 51, 52, 53, 54, then each third portion 14, 24, 34, 44 of each of the conductors is passed through the respective passage 51A, 52A, 53A and 54A a second time 133 and the method moves on to step 140. If the current measurement device 1 includes the third portions of the current conductors passing through only once, the method goes directly from step 131 to step 140.

The method continues with the following steps:

welding 140 each first end 14A, 24A, 34A, 44A of each third portion 14, 24, 34, 44 to each conductor segment 123, 223, 323, 423 at the second end 13B, 23B, 33B and 43B of the second portions 13, 23, 33 and 43, respectively;

passing 150 the first ends 12A, 22A, 32A, 42A of the conductor segments through the common passage 55A formed by the differential current sensor 55;

welding 160 each upstream connection lug 11, 21, 31, 41 to each first end 12A, 22A, 32A, 42A of each conductor segment 123, 223, 323, 423, respectively; and positioning 170 a brace 80 so as to hold the first ends 12A, 22A, 32A, 42A of the first portions a predefined position facilitating the handling and incorporation of the current measurement device 1 within the housing 2.

Figure 12:
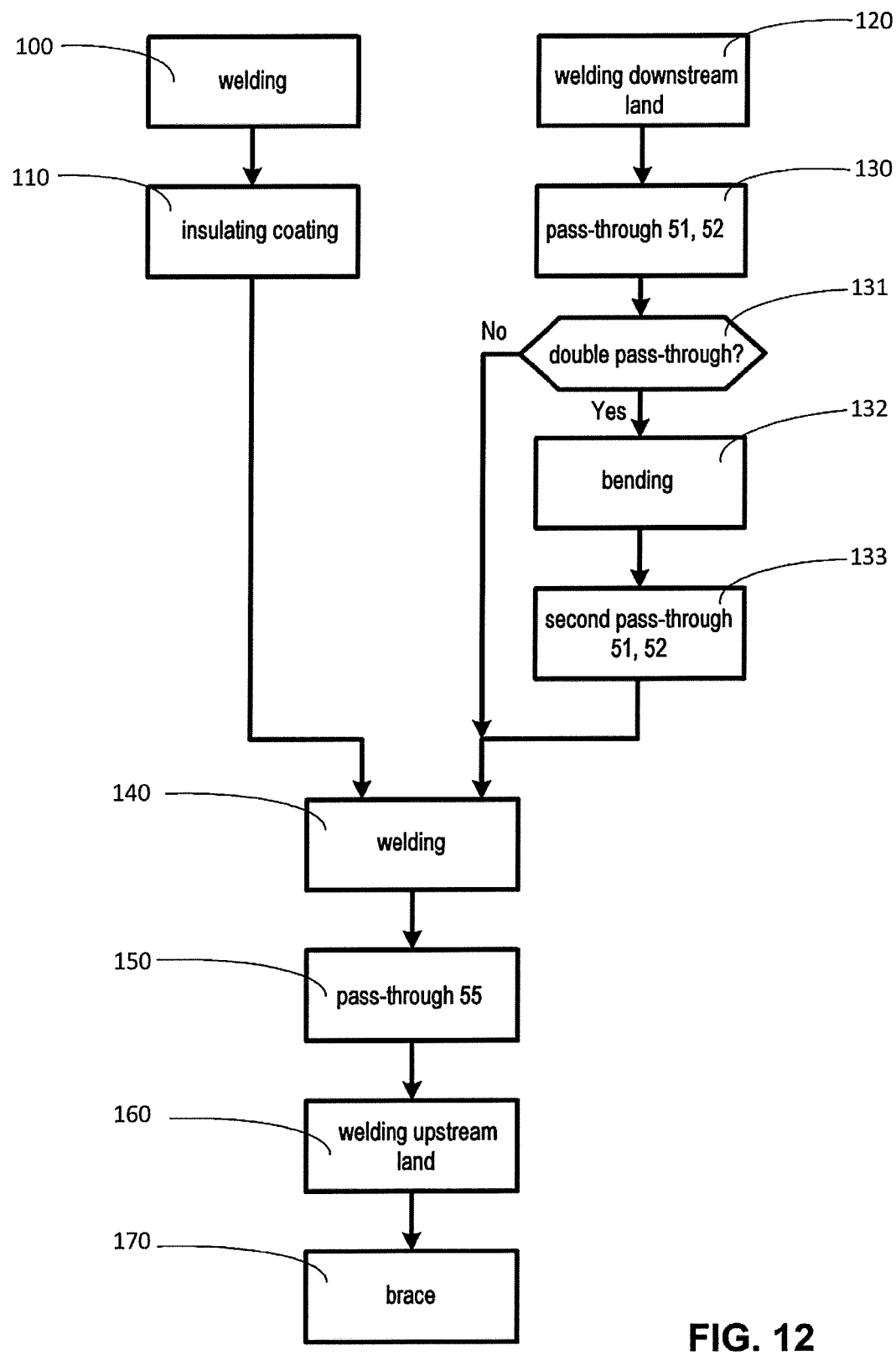
FIG. 12 shows a flowchart of a method for manufacturing a current measurement device 1.

The set of steps 100, 110 may be carried out in parallel, such as shown in FIG. 12, or in series with the set of steps 120, 130, 131, 132 and 133. Preferably, steps 150 and 160 are carried out sequentially on each of the current conductors and performed in the following specific order: first the current conductor 20, then the current conductor 30, then the current conductor 10 and finally the current conductor 40 (neutral line). By way of illustration, steps 150 and 160 carried out for the current conductor 20 include the following operations:

in step 150, the first end 22A of the conductor segment 223 is passed through the common passage 55A formed by the differential current sensor 55;

in step 160, the upstream connection lug 21 is welded to the first end 22A of the conductor segment 223.

The manufacture of the current measurement device 1 is most straightforward when the order and the sequencing of the steps described above are followed.

Figure 13:
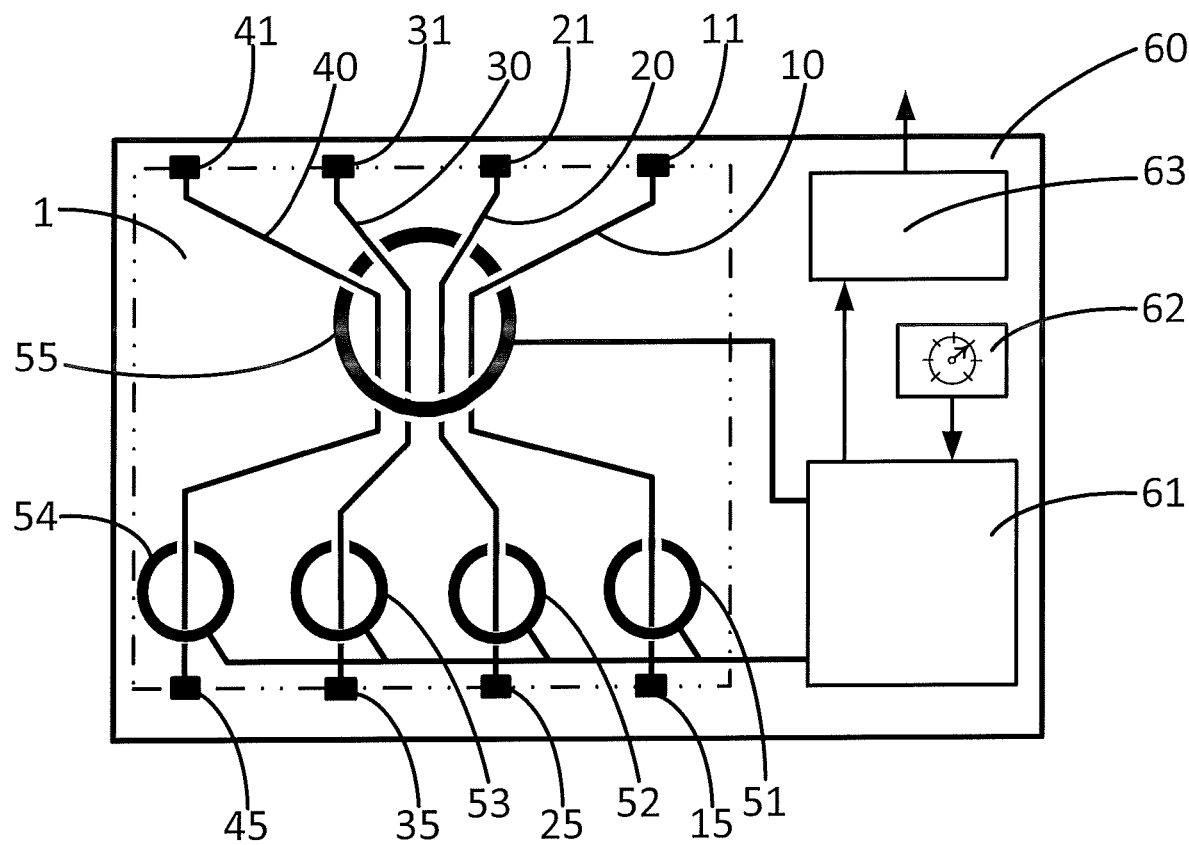
FIG. 13 is an overview of a module for protection from electrical faults including a current measurement device of the invention.

The current measurement device 1 of the invention is particularly suitable for incorporation within a module 60 for protection from electrical faults, also referred to as a "tripping device". FIG. 13 is an overview of such a protection module 60. Said module includes:

a processing unit 61, preferably including circuits for digitizing electrical signals and for calculations, for example one or more microprocessors or equivalent circuits;

an actuator 63 for actuating the electric current breaking device 71; and an adjustment device 62 that is linked to the processing unit 61, said adjustment device 62 being arranged so as to adjust at least one or more trip thresholds. A trip threshold may be adjusted during the production cycle for manufacturing the protection module in the factory and in this case it cannot be adjusted later on; in particular, the user of the protection module does not have access thereto.

Preferably, a switch or a keypad associated with a screen that is positioned on the front face of the protection module allows the trip threshold to be adjusted by the user. A first trip threshold SD is intended for protection from overcurrents in the electrical installation. For example, the value of the first threshold is 25, 50, 100 or 160 amperes. A second threshold SDD is intended for protection from differential currents. For example, the value of the second threshold SDD is 30 mA, 100 mA, 300 mA, 1 ampere or 5 amperes. The protection module 60 includes a current measurement device 1 such as is described above. Depending on the needs of the user, said module includes at least two current sensors 51, 52 and preferably a third sensor 53 for use with a three-phase network or four current sensors 51, 52, 53, 54 for use with a three-phase network with a distributed neutral line. The module 60 includes a differential current sensor 55 and at least two current conductors 10, 20 that are electrically linked to the upstream connection terminals 11, 21 and to the downstream connection terminals 15, 25 and preferably a third current conductor 30 for use with a three-phase network and a fourth current conductor 40 for use with a three-phase network with a distributed neutral line, said conductors being electrically linked to the upstream connection lugs 11, 21, 31, 41 and to the downstream connection lugs 15, 25, 35, 45, respectively.

The processing unit 61 is connected to the current sensors 51, 52, 53 and 54 and to the differential current sensor 55 so as to form:

at least one measurement M of the current flowing through each of the current conductors 51, 52, 53, 54; and a measurement of the differential current MD across all of the current conductors 51, 52, 53 and 54, the processing unit 61 being arranged so as to activate the actuator 63 to actuate the electric current breaking device 71 when at least one current measurement M or when the measurement of the differential current MD is higher than at least one trip threshold SD or SDD, respectively.

The module 60 for protection from electrical faults is intended to cooperate with the electric current breaking device 71 so as to protect the electrical installation in the case of a fault of electrical origin. The association of the protection module 60 and the electric current breaking device 71 forms a circuit breaker 70. Since the protection module is capable of measuring the differential current MD and of activating the electric current breaking device 71 when the measurement of the differential current MD is higher than a trip threshold SDD, the circuit breaker 70 is a differential circuit breaker.

Figure 14:
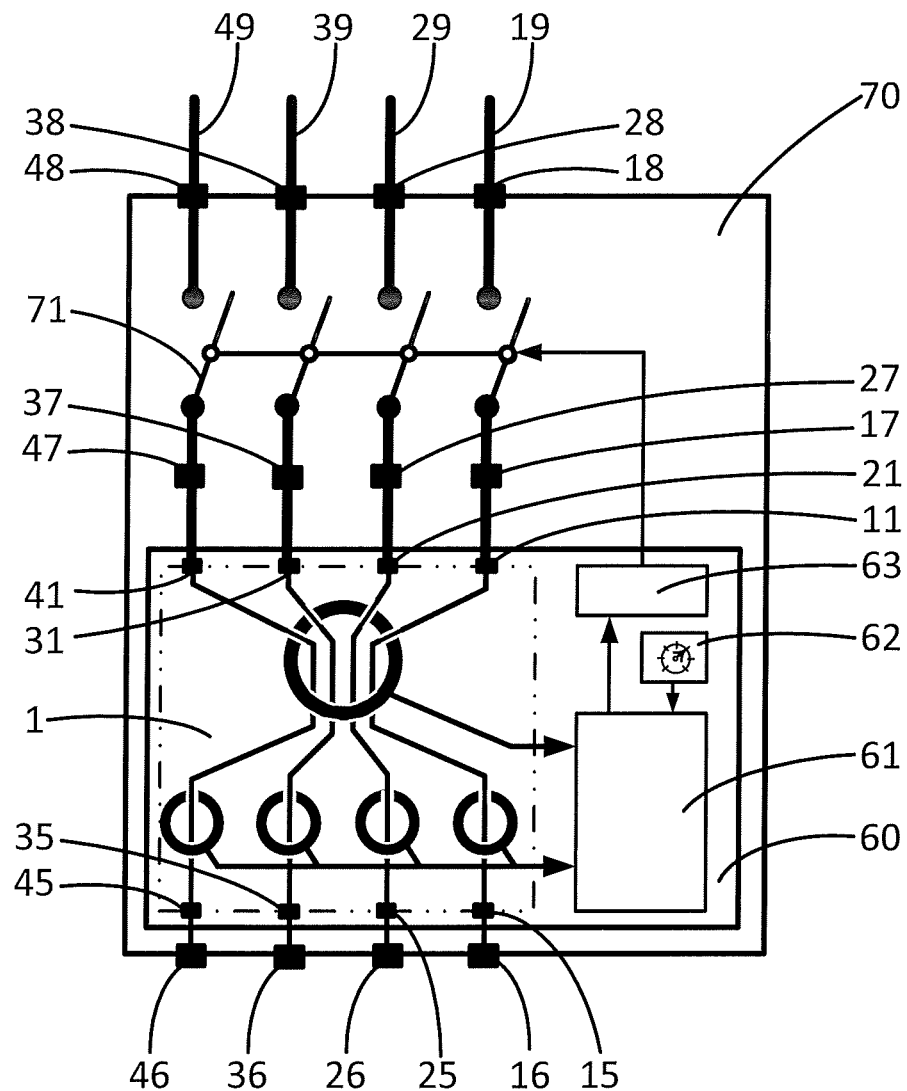
FIG. 14 is an overview of a differential circuit breaker including a protection module such as is shown in FIG. 13.

FIG. 14 is an overview of such a differential circuit breaker 70. The circuit breaker is connected to at least two electrical lines 19, 29, 39, 49, and includes:

at least two upstream connection terminals 18, 28, 38, 48 for connecting the at least two electrical lines 19, 29, 39, 49;

at least two internal connection terminals 17, 27, 37, 47; and an electric current breaking device 71 including contacts allowing the current flowing between the at least two upstream connection terminals 18, 28, 38, 48 and the at least two internal connection terminals 17, 27, 37, 47 to be established or interrupted.

The upstream connection lugs 11, 21, 31, 41 of the protection module 60 are connected to the internal connection terminals 17, 27, 37, 47, respectively, of the electric current breaking device 71. The downstream connection lugs 15, 25, 35, 45 of the protection module 60 are connected to or form part of operating terminals 16, 26, 36, 46 that are intended for the connection of electrical loads. The actuator 63 of the protection module 60 is linked to the electric current breaking device 71, preferably by a mechanical linkage, and, in the event that a trip threshold SD or SDD is exceeded, the protection module 60 transmits a command by means of the actuator 63 to actuate the electric current breaking device 71 so as to interrupt the flow of the current through the electrical lines 19, 29, 39, 49.

The particular manner of incorporation of the sensor 55 within the first space 90 and of the current sensors 51, 52, 53, 54 within the second space 91, the positioning of the upstream connection lugs 11, 21, 31 and 41 level with the second space 91 and the use of a rectangular section of low thickness for the first end 13A, 23A, 33A, 43A of the second conductor portions allow the distance between the front face 5 and the back face 6 and between the upstream face 3 and the downstream face 4 to be minimized, thereby contributing to the compactness of the measurement device 1. Thus, it is possible to have a differential protection function in a housing 2 of the same size and having the same locations for connections as a housing having until now only an overcurrent protection function. Having these functionalities in one and the same product is particularly advantageous for the user: it allows interchangeability of said protection module depending on the needs of the user, who may then size an electrical switchboard so as to subsequently fit it out with protection units having or not having differential protection without having to modify the connections or the mechanical mounting on the switchboard.

The invention claimed is:

1. A current measurement device, which device is arranged so as to be incorporated within a substantially parallelepipedal housing comprising an upstream face opposite a downstream face, a front face opposite a back face, and a first lateral face opposite a second lateral face, said current measurement device comprising:
   at least two upstream connection lugs, which lugs are intended to be electrically connected to connection lugs of an electric current breaking device for protecting at least two electrical lines;
   at least two downstream connection lugs, which lugs are intended to be electrically connected to operating terminals;
   at least two current conductors, each current conductor being arranged so as to electrically link an upstream connection lug to a downstream connection lug, respectively;
   at least two current sensors, each current sensor being positioned around a respective current conductor so as to form a respective passage for the current conductor along an axis oriented in a first direction in the upstream face and downstream face direction; and
   a differential current sensor,
   said current measurement device wherein the differential current sensor is positioned around the set of the at least two current conductors so as to form a common passage for the current conductors along an axis oriented in a second direction in the front face back face direction.

2. The current measurement device according to claim 1, wherein the current sensors and the differential current sensor are respectively embedded in spaces that are superposed between the front face and the back face, wherein:
   the current sensors are positioned in a first space of the housing, said first space being delimited by the front face, the first lateral face, the second lateral face, the upstream face, the downstream face, and an interface plane that is located between the front face and the back face; and
   the differential current sensor is positioned in a second space of the housing, said second space being delimited by the interface plane, the first lateral face, the second lateral face, the upstream face, the downstream face and the back face.

3. The current measurement device according to claim 2, wherein the upstream connection lugs are located level with the second space of the housing.

4. The current measurement device according to claim 2, wherein the downstream connection lugs are located level with the first space of the housing.

5. The current measurement device according to claim 1, wherein each upstream connection lug is aligned along an axis that is oriented in the first direction with each respective downstream connection lug to which said upstream connection lug is linked by a respective current conductor.

6. The current measurement device according to claim 1, wherein each current conductor is composed of three portions:
  a first conductor portion that is electrically connected, by a first of its ends, to the upstream connection lug, said first conductor portion being arranged so as to pass through the common passage through the differential current sensor and arranged so as to be electrically connected, by a second of its ends, to a first end of a second conductor portion;
  the second conductor portion of rectangular section that is electrically connected, by a first of its ends, to the second end of the first conductor portion, said first end being positioned substantially in the interface plane, and bent at a second of its ends to form a flat lug that is oriented in a plane perpendicular to the first direction; and
  a third conductor portion that is electrically connected, by a first of its ends, to the flat lug formed by the second end of the second conductor portion, said third conductor portion being arranged so as to pass through the passage through a current sensor and arranged so as to be electrically connected, by a second of its ends, to the downstream connection lug.

7. The current measurement device according to claim 6, wherein each third conductor portion passes through the passage through the current sensor that surrounds it at least twice, forming a loop.

8. The current measurement device according to claim 6, wherein the section of the first, second and third portions of each conductor is substantially identical in terms of area.

9. The current measurement device according to claim 1, which device is intended to measure the currents flowing through three phase lines and one neutral line of a three-phase electrical network, including a first, a second and a third current sensor, each current sensor being intended to measure a current flowing through each of the phases, and including a fourth current sensor that is intended to measure a current in the neutral line, wherein the fourth current sensor is positioned around a neutral conductor so as to form a passage for the current conductor along an axis oriented in a third direction in a first lateral face second lateral face direction.

10. A method for manufacturing a current measurement device according to claim 1, comprising the following steps:
  welding each first end of each second conductor portion to each second end of each first conductor portion so as to form a segment of each current conductor;
  depositing an insulating coating on each conductor segment so as to electrically insulate each conductor segment, first and second ends of each of said conductor segments being left free of coating for the purpose of later welding;
  welding each downstream connection lug to each second end of each third portion, respectively;
  passing each third portion of each of the conductors through the passage formed by the respective current sensor;
  selecting a single or double pass-through production variant and, in the case of a double pass-through:
  a step of bending the third portions of the current conductors so as to form a loop around each respective sensor; and
  passing each third portion of each of the conductors through the passage a second time;
  welding each first end of each third portion to each segment at the second end of the second portions, respectively;
  passing the first ends of the conductor segments through the common passage formed by the differential current sensor;
  welding each upstream connection lug to each first end of each conductor segment, respectively; and
  positioning a brace for holding the first ends of the first portions in a predefined position.

11. A module for protection from electrical faults that is intended to cooperate with an electric current breaking device, said protection module comprising:
  a processing unit;
  an actuator for actuating the electric current breaking device; and
  an adjustment device that is linked to the processing unit, said adjustment device being arranged so as to adjust at least a first trip threshold and/or a second trip threshold,
  said module for protection from electrical faults wherein a current measurement device according to claim 1, said measurement device comprising:
  at least two current sensors;
  a differential current sensor; and
  at least two current conductors that are electrically linked to upstream lugs and downstream lugs,
  the processing unit being connected to the current sensors and to the differential current sensor so as to form:
  at least one measurement of the current flowing through each of the current conductors; and
  a measurement of the differential current across all of the current conductors, the processing unit being arranged so as to activate the actuator to actuate the electric current breaking device when the current measurement is higher than the first trip threshold or when the measurement of the differential current is higher than the second trip threshold.

12. A differential circuit breaker intended to protect an electrical circuit wherein at least two electrical lines from electrical faults, said circuit breaker comprising:
  at least two upstream connection terminals for connecting at least the two electrical lines;
  at least two internal connection terminals; and
  an electric current breaking device,
  wherein said circuit breaker further comprises a module for protection from electrical faults according to claim 11;
  the electric current breaking device being connected between the at least two upstream connection terminals and the at least two internal connection terminals, said electric current breaking device including contacts allowing the current flowing between the at least two upstream connection terminals and the at least two internal connection terminals to be established or interrupted;
  the at least two internal connection terminals being connected to the at least two upstream lugs of the protection module;
  the electric current breaking device of the differential circuit breaker being connected and arranged so as to receive and to execute a command transmitted by an actuator of the protection module.

* * * * *